United States Patent [19]

Ferris et al.

[11] Patent Number: 5,163,023
[45] Date of Patent: Nov. 10, 1992

[54] MEMORY CIRCUIT CAPABLE OF REPLACING A FAULTY COLUMN WITH A SPARE COLUMN

[75] Inventors: Andrew T. Ferris, Bristol; Gordon S. Work, Warrington, both of United Kingdom

[73] Assignee: INMOS Limited, Bristol, United Kingdom

[21] Appl. No.: 602,369

[22] Filed: Oct. 23, 1990

[30] Foreign Application Priority Data

Nov. 17, 1989 [GB] United Kingdom ............... 8926004

[51] Int. Cl.$^5$ ..................... G11C 7/00; G06F 11/20
[52] U.S. Cl. ......................... 365/200; 365/189.02; 365/230.02; 371/10.2; 371/10.3
[58] Field of Search ............ 365/189.02, 200, 230.02

[56] References Cited

U.S. PATENT DOCUMENTS

| | | | |
|---|---|---|---|
| 4,346,459 | 8/1982 | Sud et al. | 365/200 |
| 4,389,715 | 6/1983 | Eaton et al. | 365/200 |
| 4,459,685 | 7/1984 | Sud et al. | 365/200 |
| 4,604,730 | 8/1986 | Yoshida et al. | 365/200 |
| 4,672,581 | 6/1987 | Waller | 365/200 |
| 4,908,798 | 3/1990 | Urai | 365/200 |

FOREIGN PATENT DOCUMENTS 2611301 6/1988 France .

OTHER PUBLICATIONS

"Circuit implementation of fusible redundant addresses on RAMs for productivity enhancement", Fizgerald and Thomas, IBM J. Res. Develop. vol. 24 No. 3, May 1980.
Bechtle, B. et al., "On Chip redundancy scheme", IBM Technical Disclosure Bulletin, vol. 22, Mar. 1980.
"An Experimental 1M bit CMOS RAM with Configurable Organization and Operation", William et al. IEEE Journal of Solid State Circuits, vol. 23 No. 5, Oct. 1988.

Primary Examiner—Joseph L. Dixon
Assistant Examiner—Jack A. Lane
Attorney, Agent, or Firm—Edward D. Manzo

[57] ABSTRACT

A memory circuit comprises a memory array having a plurality of memory cells arranged in rows and columns. Column select circuits enable access to the columns in the array. Each column select circuit is associated with a respective group of the columns and is arranged to access a selected one of the columns in the respective group. At least one spare memory column is provided. Also included are a plurality of read/write circuits associated respectively with the groups, and with the spare memory column, for reading or writing data bits between a data bus and the columns selected by the column selected circuits. Routing circuitry is connected between the read/write circuits and the data bus and is programmable with information identifying at least one faulty column. The routing circuitry is operable in response to an attempted access to the faulty column by disconnecting from the data bus the read/write circuit associated with the group containing the faulty column and connecting to the data bus the read/write circuit associated with the spare column thereby to transfer data between the spare column and the data bus.

22 Claims, 5 Drawing Sheets

MEMORY CIRCUIT CAPABLE OF REPLACING A FAULTY COLUMN WITH A SPARE COLUMN

FIELD OF THE INVENTION

The present invention relates to a memory circuit in which a faulty column can be replaced to repair the circuit.

BACKGROUND TO THE INVENTION

U.S. Pat. No. 4,672,581 describes a memory circuit comprising a memory array having a plurality or rows and columns, a plurality of column decoders for enabling access to columns in said array, each column decoder being associated with a respective group of said columns and being arranged to selectively access one of the columns in the respective group, and further comprising a spare group of memory columns and a further column decoder associated with said spare group of columns and arranged to selectively access one of the columns in said spare group, and logic means programmable to inhibit access to a selected group of said columns. Each group has associated with it a data line for reading and writing data from and into selected memory cells.

The data line for each group can be connected either to that group or to the adjacent preceding group. The data line of the first group can be connected either to the first group or to the spare group. In this circuit, any selected group of columns which is found to be defective can be replaced by the adjacent preceding group of columns. However, despite the proximity of the groups there will be some increase in access time due to the extra loading associated with the connecting circuitry between adjacent datalines. The data line of the replacement group is connected to the next preceding group and so on until the data line of the first group is connected to the spare group of columns.

Each row of the memory array is arranged to store more than one data word, only one data bit of each data word being stored in any one group of columns. Further, the number of columns in each group is equal to the number of data words to be stored in each row, and the number of groups of columns is equal to the number of data bits making up each data word. Correspondingly positioned bits of each data word are then stored in each group of columns.

Transistors are arranged to connect each data line to its associated group of columns or to the preceding group, according to the location of faulty columns apparent during testing. The connections of the data lines can be selected by blowing fuses.

With the repairable memory circuit described above, the column decoder associated with the spare group of columns is connected to the data line of the next adjacent group so that a whole group of columns containing the faulty column is replaced by a whole group of spare columns. This means that, for example for the case where each group contains sixteen columns then sixteen columns are required for each level of redundancy. By each level of redundancy is meant the number of groups in which faulty columns are replaced by spare columns.

Also, the connection of the data line associated with one group to the next preceding group incurs a penalty in terms of an increased signal path length. In U.S. Pat. No. 4,672,581 this penalty is incurred where the data line signal is developing during a read cycle, i.e. between the read/write circuitry and the column decoder, hence entailing an undesirable additional load on the developing data line signal.

It is desirable to reduce this load, particularly for fast access static random access memories (SRAMs), so that the time taken to achieve a bitline differential sufficient for sensing is not impaired. It is further desirable to increase the efficiency of repair of the memory circuit.

SUMMARY OF THE INVENTION

According to the present invention there is provided a memory circuit for connection to a data bus, the circuit comprising:

a memory array having a plurality of memory cells arranged in rows and columns;

a plurality of column select circuits for enabling access to columns in said array, each column select circuit being associated with a respective group of said columns and being arranged to access a selected one of the columns in the respective group;

at least one spare memory column and means arranged to access said spare column;

a plurality of read/write circuits associated respectively with the said groups, and with said spare column, for reading or writing data bits between the data bus and the columns selected by the column select circuits; and routing circuitry connected between the read/write circuits and the data bus and being programmable with information identifying at least one faulty column, the routing circuitry being operable in response to an attempted access to said faulty column to disconnect from the data bus the read/write circuit associated with the group containing the faulty column and to connect to the data bus the read/write circuit associated with the spare column thereby to connect said spare column to the data bus, said routing circuitry being arranged to provide selectively one of a direct path between the selected column of a group and the corresponding bit position of the data bus and a shift path between the selected column of an adjacent group and the aforementioned bit position of the data bus, said routing circuitry being programmable so that on identification of a faulty column it disconnects the read/write circuit associated with the faulty column and connects the read/write circuit associated with the spare column to the endmost bit position of the data bus and causes the adjacent preceding groups, down to the group containing the faulty column, to adopt their shift paths so as to connect the selected columns to their respective adjacent bit positions of the data bus.

The spare column could be connected either to the most significant bit with groups being connected to their adjacent lower bit positions or it could be connected to the least significant bit position with groups being connected to their adjacent higher bit positions.

Preferably the read/write circuit comprises a sense amplifier which provides full logic levels and a write driver. A suitable sense amplifier is described in our copending application Ser. No. 562,100 filed Aug. 2, 1990.

The circuit is particularly suitable for wider word memories, i.e. for word lengths of 8 bits or greater. It is especially suited to present microprocessor applications where words are generally 32 bits, or even 64 bits.

This arrangement has the advantage over that described in U.S. Pat. No. 4,672,581 in that the efficiency of the repair mechanism is increased, since each faulty column requires only a single replacement column. Also, on reading from the memory, as diversion of the data bits is carried out by the routing circuitry after full logic levels have been established by the read sense amplifiers there is no extra loading on the developing dataline signal.

The invention is particularly suited to the data storage structure described above with reference to U.S. Pat. No. 4,672,581, in which each row of the memory array is arranged to store more than one data word, only one data bit of each data word being stored in any one group of columns. Further, the number of columns in each group is equal to the number of data words to be stored in each row, and the number of groups of columns is equal to the number of data bits making up each data word. Correspondingly positioned bits of each data word are then stored in each group of columns. The data bus has a plurality of bit positions corresponding to the number of bits in a word to be stored in the memory. A "word position" is the position within each group of the columns containing the data bits for that word. A "bit position" is the position of the bit in the word, corresponding to the number of the group within the array.

A column select circuit can be associated with the spare column so that all the paths between bit lines and datalines have similar properties. The invention provides for the provision of one or more spare columns. Where there is more than one spare column, the column select circuit can be used to select one of the spare columns when redundancy is implemented.

For a better understanding of the present invention, and to show how the same may be carried into effect, reference will now be made by way of example to the accompanying drawings.

DESCRIPTION OF THE PREFERRED EMBODIMENT

Figure 1:
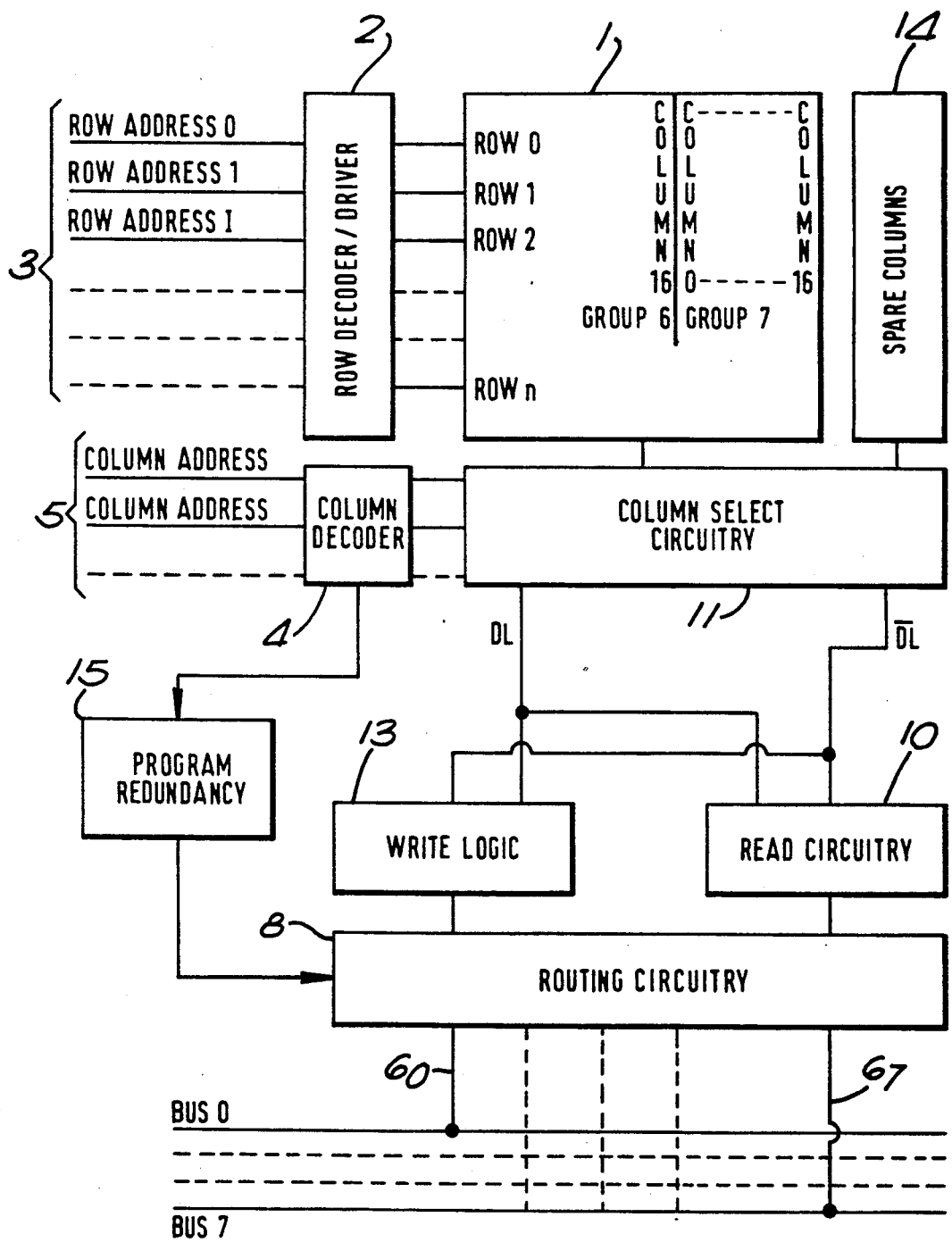
FIG. 1 is a diagram of a memory circuit which can be repaired.

FIG. 1 shows a block diagram of a memory circuit including a random access memory (RAM) 1 and enabling the RAM to be repaired. In this embodiment, the RAM is an array of memory cells having n rows (where n is typically 128, 256 or 512) and 16×8 columns. In the illustrated embodiment each word to be stored in the RAM is 8 bits long such that sixteen words can be stored in each row of the RAM array 1.

Each row of the RAM array 1 is connected to a row decoder/driver 2 arranged to access an individual row of the RAM array 1 upon receipt of the appropriate multi-bit row address on the address lines 3.

Figure 2:
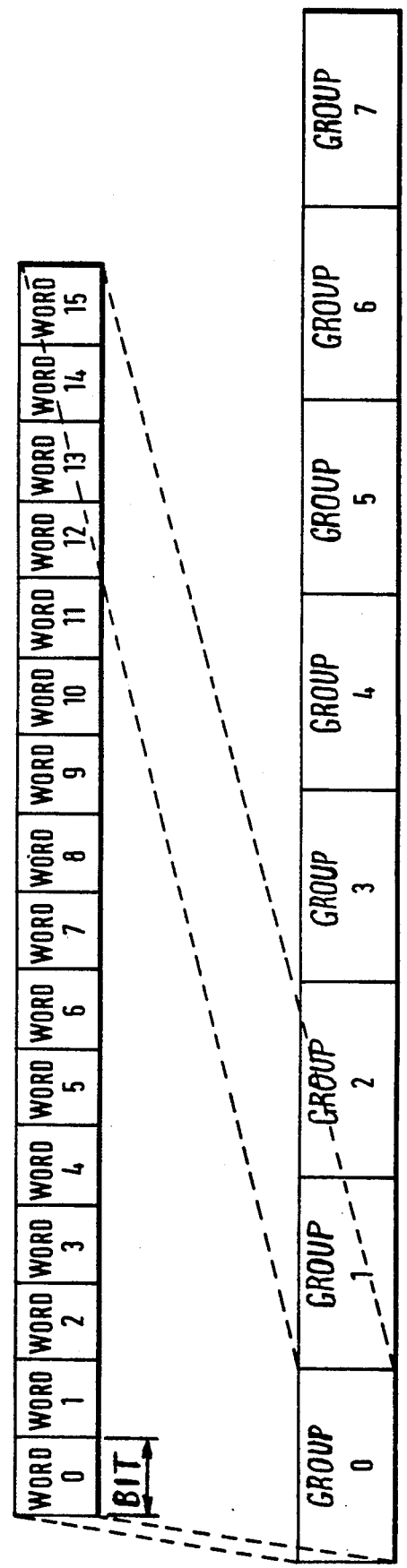
FIG. 2 shows schematically the arrangement of data bits and words in one row of the memory.

The data items stored in the individual cells along each row are arranged in an interleaved manner as is illustrated in FIG. 2. FIG. 2 shows the arrangement of sixteen words. The first bit of the first word is stored in the leftmost column WORD 0 of the leftmost group BIT 0. The second bit of the first word is stored in the leftmost column WORD 0 of the next group BIT 1. The first bit of the second word is stored in the next column WORD 1 of the leftmost group BIT 0. As is apparent, the eight bits of each word are stored in respective columns occupying the same position in each group such that to retrieve one word it is only necessary to access one column from each group of sixteen columns. Thus, to access word 0 it is only necessary to access the most lefthand column of every group of sixteen columns. The data items accessed would then be BITS 0 to 7 of word 0.

A column decoder 4 is provided to decode column address signals received on column address lines 5 to provide a signal selecting one of sixteen columns in each group to column select circuitry 11. The column select circuitry 11 comprises a plurality of column select circuits $CS_0$–$CS_7$ (see FIG. 4) associated respectively with the groups of columns BIT 0 to BIT 7 and each arranged to selectively access one of the columns in its associated group. Preferably, the column select circuits $CS_0$–$CS_7$ are ganged switches such that when one column is selected within its group, the other circuits similarly select the corresponding columns in their respective group.

To access a word in the RAM array 1 it is necessary to put the row address of this word on the row address lines 3 and the column address on the column address line 5. Because the column select circuits $CS_0$–$CS_7$ are ganged together each column select circuit will similarly access the corresponding column in its associated group such that every cell containing bits of the selected word on the accessed row will be simultaneously accessed.

The memory circuit includes also write logic 13 and read circuitry 10 coupled to the column select circuitry 11 via access lines DL, $\overline{DL}$. The memory circuit illustrated in FIG. 1 includes not only the address lines 3 and 5 but also a plurality of input and output data lines 6 connected to a data bus 9. Each data line $6_N$ is connected to a corresponding bus position BUS N of the bus 9. It is intended that the memory circuit of FIG. 1 would be used with a processor or other control units (not shown) which would address the RAM array 1 to either output or input data via the lines 6 in normal manner in accordance with a program.

To read data, the words stored in the array 1 are accessed as described above and the data items are sensed by the read circuitry 10 and connected by way of routing circuitry (designated generally by box 8) to the data bus 9.

Similarly, to write data into the array 1, the word locations are accessed in the array 1 and the data items to be written into those cells are presented from the data bus 9 via the routing circuitry 8 and write logic 13. This data will then be written into the accessed cells of the array 1 effectively in the reverse manner of the read operation described above. In both the read and the write operations the data is fed in accordance with the invention between the data bus 9 and the read/write circuits by way of routing circuitry 8.

The write logic 13 comprises a respective write driver associated with each group of columns while the read circuitry comprises a plurality of sense amplifiers similarly associated respectively with the groups.

The memory circuit shown in FIG. 1 also includes a group of spare columns 14. This group of spare columns can contain 1, 2 or 4 columns depending on the predicted defect density associated with the manufacturing process of the memory. This spare group of columns 14 is connected to the RAM array 1 such that the rows thereof can be accessed by the row decoder/driver 2. Preferably, the spare memory columns 14 have the same type of memory cells as the RAM array 1.

The spare group 14 has associated therewith its own column select circuit $CS_{sp}$, sense amplifier and write driver (FIG. 4) which effectively provide the spare columns with their own data path independent of the data paths of other groups. When redundancy is implemented, as programmed by a program redundancy circuit 15, the sense amplifier or write driver associated with the spare group can hence be connected to a bit position of the data bus 9. As will become clearer in the following, in the preferred embodiment the spare column is connected to either the most significant bit (MSB) or least significant bit (LSB) position.

The data bus 9 connects the memory cells to the input/output pads of the memory. The data bus can either be two way, i.e. shared for read and write operations or can consist of two separate, input and output, buses. In this description the two way bus is described for simplicity. The data bus has a width of eight bits.

Figure 3:
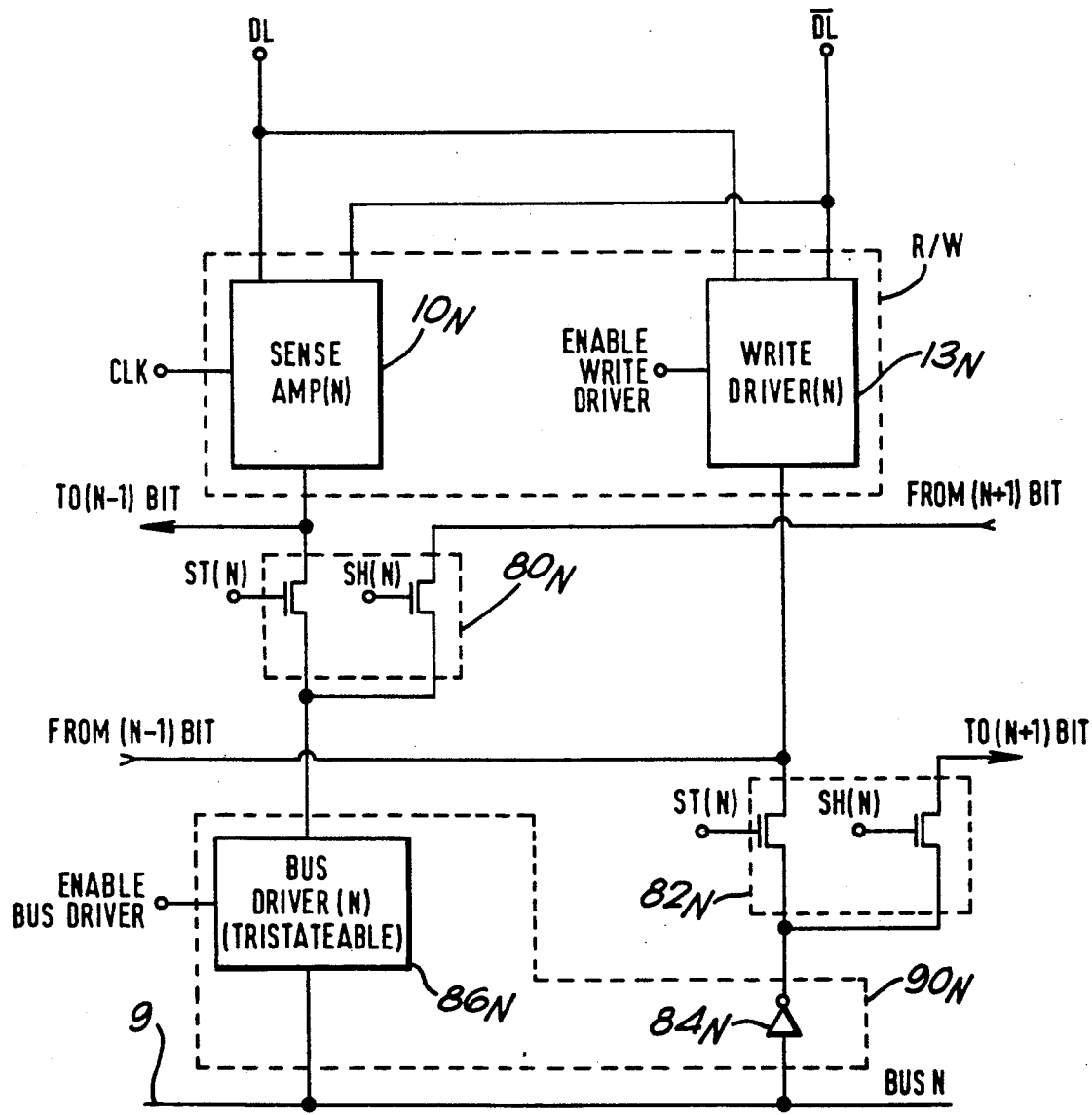
FIG. 3 is a diagram showing the logic circuits in the routing circuitry and associated with the Nth position of the data bus.

FIG. 3 shows the circuits associated with the Nth group of columns BIT N. There is a sense amplifier $10_N$ and a write driver $13_N$ for the group, together annotated as R/W.

The routing circuitry comprises for each group two logic circuits $80_N$, $82_N$ associated respectively with the sense amplifier $10_N$ and write driver $13_N$. Each logic circuit $80_N$, $82_N$ comprises a pair of field effect transistors (FETs) ST(N) and SH(N) which enable the column of the Nth group selected by the column select circuit $CS_N$ to be connected to the Nth bit position in the data bus via a "straight" path or, during redundancy, enable the column of the N+1th group selected by the column select circuit $CS_{N+1}$ to be connected to the Nth position in the data bus via a "shift" path. Which path is adopted in each logic circuit depends on the state of signals applied to the gates of the FETs ST(N) and SH(N). The production of these signals is described in more detail hereinafter.

An inverter 84 is connected between the data bus 9 and the write driver $13_N$ to act as a buffer. A bus driver $86_N$ is connected between the data bus 9 and the sense amplifier $10_N$: this is disabled by an ENABLE BUS DRIVER signal turning off during a write operation. These components are grouped for the following explanation into a buffer/bus driver circuit $90_N$.

Figure 4:
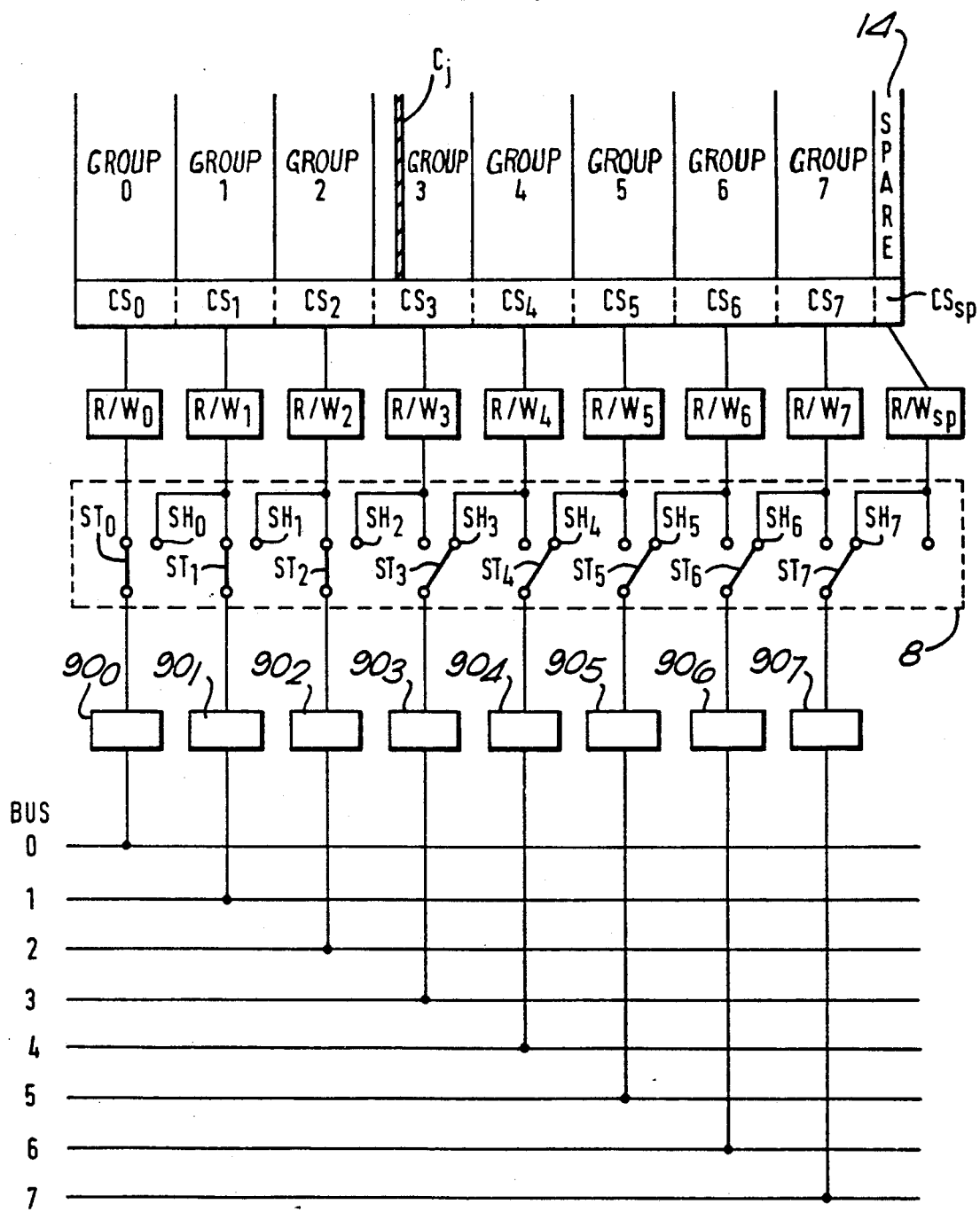
FIG. 4 shows the data routing adopted when an 8 bit word with a faulty column in the fourth group (bit position 3) is addressed.

Reference is now made to FIG. 4 to describe the implementation of redundancy in more detail. FIG. 4 shows 8 groups BIT0–BIT7 in an array, while the spare column is indicated schematically as 14. There is associated with the spare column a column select circuit $CS_{sp}$. In this example, there is a faulty column $C_j$ in the fourth group BIT3, where the fourth bit of the jth word would otherwise be stored. As can readily be seen from FIG. 4, a read/write circuit R/W and buffer/bus driver circuit 90 is associated with each group. The transistors ST(N) and SH(N) in the routing circuitry 8 are shown diagrammatically as switches. When an attempt is made to access the word which has one of its bits stored in the faulty column $C_j$, its associated read/write circuit R/W$_3$ is disconnected from the data bus 9. The read/write circuit R/W$_{sp}$ associated with the spare group 14 is connected to t significant bit (MSB) position (BUS 7) of the data bus 9. The logic circuit in the routing circuitry associated with the adjacent preceding group BIT7 is caused to adopt its shift path and therefore connects its read/write circuit R/W$_7$ to the seventh position (BUS 6) of the data bus. This applies for successive ones of the preceding groups down to group BIT4, which causes its read/write circuit R/W$_4$ to be connected to the fourth position (BUS 3) of the data bus. The group BIT3 is not used, and the groups BIT0 to BIT2 are directly connected to their normal respective bit positions on the data bus.

There are three pieces of information required to effect redundancy: (i) that redundancy is being implemented; (ii) the column select address of the faulty column, i.e. the word position; and (iii) the position of the group of columns which contains the faulty column, i.e. the bit position. These three pieces of information are programmed into the memory circuit by blowing fuses, as explained in the following with reference to FIG. 5.

Figure 5:
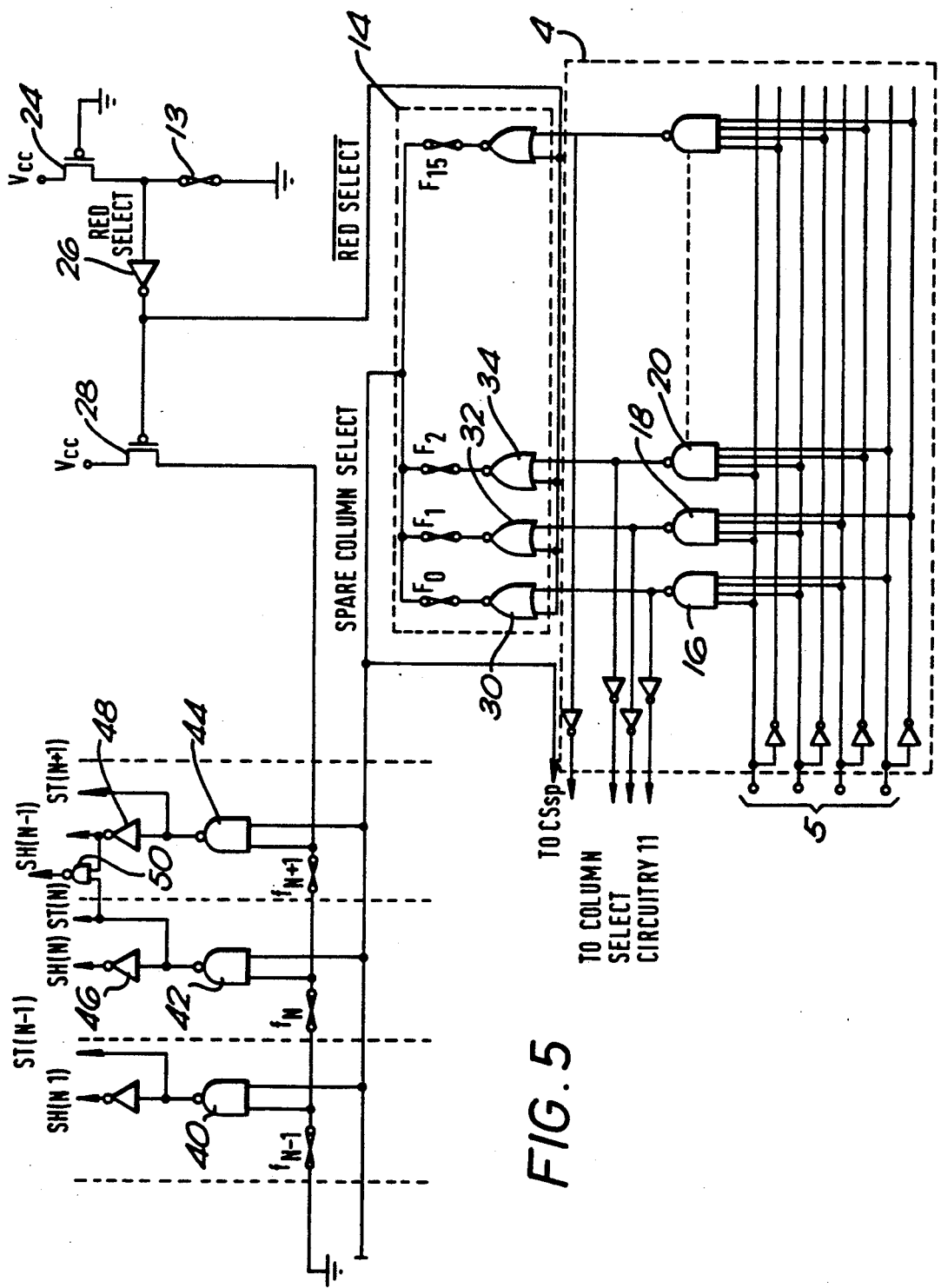
FIG. 5 is a circuit diagram showing how the routing circuitry is programmed.

FIG. 5 shows the column decoder 4 in more detail. It comprises four input leads 5 for four address signals. Each input signal is inverted and the logic input signals and their inverted signals are fed in different combinations to sixteen NAND gates 16,18,20, ... The output of one only of these NAND gates 16,18,20 ... will be low for each column address, thereby to select the word position. The circuit shown is for a redundancy scheme in which there is only one level of redundancy and one spare column replaces one faulty column.

FIG. 5 shows a redundancy select circuit comprising a fuse 13, in series with an FET 24 whose gate is at ground, and which is blown to enable redundancy. When the fuse 13 is blown, a RED SELECT signal is held high by the FET 24; otherwise the RED SELECT signal is low and redundancy is not being implemented. The RED SELECT signal is inverted by an inverter 26 and the inverted signal $\overline{\text{RED SELECT}}$ is supplied to the gate of an FET 28 and to a spare column select fuse circuit 14.

The spare column select fuse circuit 14 comprises sixteen NOR gates 30,32,34 ... each with a fuse F0–F15 connected in series with its output; more generally the number of NOR gates and fuses equals the number of words in each row.

When redundancy is implemented, one input of each NOR gate is held low by the RED SELECT signal. The other input receives the output of a respective NAND gate in the column decoder 4.

When the fuse 13 is blown such that output signal $\overline{\text{RED SELECT}}$ goes LOW, this enables redundancy. Next fifteen of the sixteen fuses F0–F15 are blown in the spare column select fuse circuit 14. The unblown fuse $F_j$ is the fuse in the output of the NOR gate connected to the NAND gate receiving the address (or word position) of the faulty column $C_j$. A SPARE COL SELECT signal at the output of the fuse circuit 14 will now go HIGH (active) whenever the address of the faulty column is selected via the column decoder since the input of the relevant NOR gate will go LOW.

The FET 28 has eight fuses (three of which fN−1, fN, fN+1. are shown) connected in series in its drain. There is a fuse $f_N$ associated with each group of columns. For the embodiment of FIG. 4, one of these fuses $f_3$ is blown in the bit position of the faulty column; this allows the line to the right of the blown fuse to be held high by the gate, while the line to the left is hard-wired to ground and hence LOW. This determines the bit position from which shifting in the logic circuits begins.

In practice, when the address of the faulty column is selected SPARE COLUMN SELECT goes HIGH, shifting takes place to the right of the faulty column and the normal "straight" path is active to the left. The read/write circuit in the bit position of the faulty column becomes redundant for that cycle.

The production of control signals for feeding to the transistors SH(N) and ST(N) in the logic circuits 80,82 is effected by providing for each group a NAND gate 40,42,44 . . . whose output is connected directly to the gates of the ST(N) transistor or, inverted, to the gates of the SH(N) transistor. Consider for example the case where the fuse $f_N$ has been blown and the faulty column addressed. The NAND gate 40 and those to the left of it will have their SPARE COLUMN SELECT input high and their other input low. The output of the NAND gate 40 is hence HIGH, turning on the FET ST and thus activating the straight path for groups BIT 0 to BITN-1. The NAND gate 42 and those to the right of it have two HIGH inputs and so the outputs are LOW. These outputs are inverted by the invertors 46,48 to provide a high signal to the FETs SH thereby activating the shift paths for groups BITN to BIT7.

The effect of this to disconnect the read/write circuit of the Nth group has been discussed above with reference to FIG. 4.

FIG. 5 shows a NAND gate 50 whose inputs are the straight control line ST(N) of the Nth group and the shift control line SH(N+1) of the N+1th group. Similar NAND gates are so connected (but not shown) for N=1 to 7. The purpose of this gate 50 is to produce a signal ENABLE WRITE DRIVER which when low disables the write driver $13_N$ when the read/write circuit $R/W_N$ of the Nth group has been disconnected from the data bus. This avoids a large d.c. current path in a faulty column if, say, a short circuit were present, thereby increasing the power consumption of a part where redundancy has been implemented.

The above explanation of the preferred embodiment has been in relation to a memory where sixteen 8 bit words are stored in each row and where there is a single spare column. It will be appreciated that the present invention is readily applicable to other storage arrangement, for example to the storage of four 32 bit words. In such a case, it could be appropriate to have a spare group of 4 spare columns with the column select circuit associated with the spare group being ganged with the column select circuits associated with the memory groups. In this case, it can be arranged that the selected replacement column occupies the same word position in the spare group as the faulty column does in its group. If a faulty column is then identified in a different word position in its group, this can be replaced during a subsequent repair cycle by the similarly positioned column in the same spare group. This approach is generally only suitable where there are a few long words to be stored, since for the storage of more, shorter words it is not cost effective to have a spare group containing, for example, sixteen spare columns. In fact, it is one of the principle advantages of the present invention that a small number of spare columns only is required to repair a faulty memory circuit.

Also, the example described above explains how the routing circuitry 8 shifts the selected column in each group to the right hand side of the group containing the faulty column so as to connect them to the respective adjacent positions on the bus. That is, in the general case, bit position N will be connected to bus position N−1 for groups to the right hand side of the group containing the faulty column. The spare column is then connected to the most significant bit position of the bus. Clearly, the inverse arrangement could be implemented in a similar manner, that is with the spare column being connected to the least significant bit position of the data bus and each of the other bit positions being shifted to the next higher adjacent bit position of the data bus respectively. With the above scheme using a single spare column, it is not possible to repair two columns that occupy the same word position in two different groups of columns. However, it is possible to implement more complex routing schemes using the principle of the present invention. For example, to repair the above fault condition, columns could be connected to bus positions greater by 1 or 2 than their normal bus position when redundancy is implemented. Naturally, these and other implementations complicate the routing circuitry which is required, but may be justified if the statistical distribution of faults in the array warrant it.

What is claimed is:

1. A memory circuit for connection to a data bus having a plurality of data bus lines corresponding respectively to a plurality of bit positions for the transmission of respective bits of a data word arranged between a most significant bit position and a least significant bit position, the circuit comprising:

a memory array having a plurality of memory cells arranged in rows and columns;

a plurality of column select circuits for enabling access to columns in said array, each column select circuit being associated with a respective one of a plurality of groups of said columns and being arranged to access a selected on of the columns in one of said plurality of respective groups;

at least one spare memory column;

access circuitry for accessing said at least one spare column;

a plurality of read circuits associated respectively with said plurality of groups of columns, and with said at least one spare column, for reading data bits onto the data bus in respective ones of said bit positions from the columns selected by the column select circuits;

routing circuitry comprising a plurality of sets of first and second gate elements, each set associated with one of said groups of columns, the first gate element of each set being connected between one of said read circuits, associated with a respective one of said plurality of groups of columns, and a respective one of said data bus lines normally associated with said respective one of said plurality of groups and the second gate element of each set being connected between one of said read circuits, associated with one of said groups of columns adjacent to said respective one of said plurality of groups of columns, and said respective one of said data bus lines of the data bus;

a plurality of logic circuits associated respectively with said plurality of groups of columns, each logic circuit being connected to receive a column group signal, having a predetermined logic value depending on whether or not one of said groups of columns contains a faulty column, and a column signal having a predetermined logic value depending on whether or not said faulty column has been selected;

said logic circuits being connected to supply to the first and second gate elements respective control signals of opposite logic values so that one of the first and second gate elements is conductive while the other of the gate element is non-conductive;

said control signals being supplied so that, on an attempted access to said faulty column, the first gate element associated with said one of said groups of columns containing said faulty column is rendered non-conductive so as to disconnect the read circuit associated with said one of said groups of columns from the data bus; said second gate elements associated with one of said groups of columns containing said faulty column and all of the groups of columns to one side of the groups of columns containing said faulty column and including said at least one spare column are rendered conductive; and said first gate elements associated with groups of columns to the other side of said group of columns containing the faulty column are rendered conductive whereas on an access to a column other than said faulty column within the group of columns containing the faulty column, the read circuit associated with said one of said groups of columns remains connected to the data bus, whereby one faulty column may be replaced by a corresponding column from an adjacent group.

2. The memory circuit as claimed in claim 1, which further comprises column address decoding circuitry associated with the column select circuits for decoding column addresses.

3. The memory circuit as claimed in claim 1, wherein each read circuit comprises a sense amplifier.

4. The memory circuit as claimed in claim 1, in which each row of the memory array is arranged to store more than one data word, only one data bit of each data word being stored in any one group of columns, wherein the number of the columns in each group is equal to the number of data words to be stored in each row, and the number of groups of columns is equal to the number of data bits making up each data word with correspondingly positioned bits of each data word being stored in each group of columns.

5. The memory circuit as claimed in claim 1, in which said access circuitry comprises another column select circuit.

6. The memory circuit as claimed in claim 1, wherein, when access to said faulty column is attempted, said at least one spare column is connected either to one of said data bus lines corresponding to the most significant bit with adjacent groups being connected to adjacent lower bit positions or to one of said data bus lines corresponding to the least significant bit position with adjacent groups being connected to adjacent higher bit positions.

7. The memory circuit as claimed in claim 1, wherein the first and second gate elements are field effect transistors having their gate electrodes connected to receive the control signals from the logic circuits.

8. The memory circuit as claimed in claim 1, further comprising a faulty column select circuit which comprises a plurality of fuses which can selectively be blown to identify the position of the faulty column within the group to produce said column signal.

9. A memory circuit as claimed in claim 2, which further comprises a write driver for actuating each said write circuit and circuit for disabling said write driver of one of said write circuits which has been disconnected from the data bus.

10. A memory circuit as claimed in claim 1, in which each row of the memory array is arranged to store more than one data word, only one data bit of each data word being stored in any one group of columns, wherein the number of columns in each group is equal to the number of data words to be stored in each row, and the number of groups of columns is equal to the number of data bits making up each data word with correspondingly positioned bits of each data word being stored in each group of columns and in which said access circuitry comprises a column select circuit.

11. The memory circuit as claimed in claim 1 wherein each of said logic circuits comprises a NAND gate which has one input selectively connected to ground or to a supply voltage, depending on whether or not one of said groups of columns associated with said NAND gate contains a faulty column, and another input connected to receive said column signal.

12. The memory circuit as claimed in claim 11, further comprising a plurality of fuses connected respectively between said one input of each logic circuit and ground, the groups of columns containing the faulty column being identified by blowing the fuse associated with said group of columns containing said faulty column.

13. A memory circuit for connection to a data bus having a plurality of data bus lines corresponding respectively to a plurality of bit positions for the transmission of respective bits of a data word arranged between a most significant bit position and a least significant bit position, the circuit comprising:

a memory array having a plurality of memory cells arranged in rows and columns;

a plurality of column select circuits for enabling access to columns to said array, each column select circuit being associated with a respective one of a plurality of groups of said columns and being arranged to access a selected one of the columns in one of said plurality of respective groups;

at least one spare memory column;

access circuitry arranged to access said at least one spare column;

a plurality of write circuits associated respectively with said plurality of groups of columns, and with said at least one spare column, for writing data bits from the data bus in respective ones of said bit positions to the columns selected by the column select circuits;

routing circuitry comprising a plurality of sets of first and second gate elements, each set associated with one of said groups of columns, the first gate element of each set being connected between one of said write circuits, associated with a respective one of said plurality of groups of columns, and a respective one of said data bus lines normally associated with said respective one of said plurality of groups and the second gate element of each set being connected between one of said write circuits, associated with one of said groups of columns adjacent to said respective one of said plurality of groups of columns, and said respective one of said data bus lines of the data bus;

a plurality of logic circuits associated respectively with said plurality of groups of columns, each logic circuit being connected to receive a column group signal, having a predetermined logic value depending on whether or not one of said groups of columns contains a faulty column, and a column signal having a predetermined logic value depending on whether or not said faulty column has been selected;

said logic circuits being connected to supply to the first and second gate elements respective control signals of opposite logic values so that one of the first and second gate elements is conductive while the other of the gate elements is non-conductive;

said control signals being supplied so that, on an attempted access to said faulty column, the first gate element associated with said one of said groups of columns containing said faulty column is rendered non-conductive so as to disconnect the write circuit associated with said one of said groups of columns from the data bus;

said second gate elements associated with said one of said groups of columns containing said faulty column and all of the groups of columns to one side of the groups of columns containing said faulty column and including said at least one spare column are rendered conductive; and said first gate elements associated with groups of columns to the other side of said group of columns containing the faulty column are rendered conductive whereas on an access to a column other than said faulty column within the group of columns containing the faulty column, the write circuit associated with said one of said groups of columns remains connected to the data bus, whereby one faulty column may be replaced by a corresponding column from an adjacent group.

14. The memory circuit as claimed in claim 13, which further comprises column address decoding circuitry associated with the column select circuits for decoding column addresses.

15. The memory circuit as claimed in claim 13, wherein each said write circuit comprises a write driver.

16. The memory circuit as claimed in claim 13, in which each row of the memory array is arranged to store more than one data word, only one data bit of each data word being stored in any one group of columns, wherein the number of columns in each group is equal to the number of data words to be stored in each row, and the number of groups of columns is equal to the number of data bits making up each word with correspondingly positioned bits of each data word being stored in each group of columns.

17. The memory circuit as claimed in claim 13, in which said access circuitry comprises another column select circuit.

18. The memory circuit as claimed in claim 13 wherein on an attempted access to said faulty column said at least one spare column is connected either to one of said data bus lines corresponding to the most significant bit with adjacent groups being connected to adjacent lower bit positions or to one of said data bus lines corresponding to the least significant bit position with adjacent groups being connected to adjacent higher bit positions.

19. The memory circuit as claimed in claim 13, wherein the first and second gate elements are field effect transistors having their gate electrodes connected to receive the control signals from the logic circuits.

20. The memory circuit as claimed in claim 13, further comprising a faulty column select circuit which comprises a plurality of fuses which can selectively be blown to identify the position of the faulty column within the group to produce said column signal.

21. The memory circuit as claimed in claim 13 wherein each of said logic circuits comprises a NAND gate which has one input selectively connected to ground or to a supply voltage, depending on whether or not one of said groups of columns associated with said NAND gate contains a faulty column, and another input connected to receive said column signal.

22. The memory circuit as claimed in claim 21, further comprising a plurality of fuses connected respectively between said one input of each logic circuit and ground, the group containing the faulty column being identified by blowing the fuse associated with that column group.

* * * * *

UNITED STATES PATENT AND TRADEMARK OFFICE
CERTIFICATE OF CORRECTION

PATENT NO. : 5,163,023
DATED : November 10, 1992
INVENTOR(S) : Andrew T. Ferris and Fordon S. Work It is certified that error appears in the above-indentified patent and that said Letters Patent is hereby corrected as shown below:

Column 8,

Claim 1, line 34, change "on" to --one--.

Column 10, line 5,

Claim 9. A memory circuit as claimed in claim [2] 13, which further comprises a plurality of write drivers for actuating each said write circuit and circuitry for disabling said write driver of one of said write circuits when said one of said write circuits [which] has been disconnected from the data bus.

Signed and Sealed this

Eighth Day of February, 1994

Attest:

BRUCE LEHMAN

Attesting Officer     Commissioner of Patents and Trademarks